United States Patent [19]

Wisbey

[11] Patent Number: 4,504,758
[45] Date of Patent: Mar. 12, 1985

[54] SURFACE ACOUSTIC WAVE DEVICES HAVING FREQUENCY RESPONSE THAT CAN BE ADJUSTED

[75] Inventor: Philip H. Wisbey, Colchester, England

[73] Assignee: The Marconi Company Limited, Stanmore, England

[21] Appl. No.: 476,602

[22] Filed: Mar. 18, 1983

[30] Foreign Application Priority Data

Mar. 31, 1982 [GB] United Kingdom ............. 8209558

[51] Int. Cl.$^3$ .............................................. H03H 9/25
[52] U.S. Cl. ................................. 310/313 R; 310/312
[58] Field of Search ........... 310/313 R, 313 A, 313 B, 310/313 D, 312; 333/150, 152, 153, 193, 195, 196; 331/107; 29/25.35; 156/625

[56] References Cited

U.S. PATENT DOCUMENTS

| | | | |
|---|---|---|---|
| 4,059,831 | 11/1977 | Epstein | 333/150 |
| 4,217,564 | 8/1980 | Autran | 333/152 |
| 4,309,679 | 1/1982 | Furuya et al. | 333/153 |
| 4,353,043 | 10/1982 | Gunton | 333/151 |
| 4,442,574 | 4/1984 | Wanuga et al. | 310/312 |

FOREIGN PATENT DOCUMENTS

| | | |
|---|---|---|
| 1396539 | 6/1975 | United Kingdom . |
| 1451326 | 9/1976 | United Kingdom . |
| 1490882 | 11/1977 | United Kingdom . |
| 1525906 | 9/1978 | United Kingdom . |
| 1530665 | 11/1978 | United Kingdom . |
| 1590393 | 6/1981 | United Kingdom . |

Primary Examiner—William H. Beha, Jr.
Assistant Examiner—D. L. Rebsch
Attorney, Agent, or Firm—Spencer & Frank

[57] ABSTRACT

In the manufacture of surface acoustic wave devices it is necessary to manufacture master patterns from which interdigitated electrodes are produced photographically. The manufacture of the master is expensive and a new master is needed for each new device required to operate at a different frequency. The invention overcomes this problem in the device shown in FIG. 1 by the use of transducers 2 and 5, each constituted by separate groups 3 or 6 of interdigitated fingers. The effect of this is for the transducer to have peak frequency responses at a whole series of frequency values. These frequency values can be shifted up or down by varying the velocity of the surface acoustic waves in the region of the appropriate transducer. This is done using any one of a number of different methods but, in the embodiment of FIG. 1, metal layers 8 and 9 are applied and then adjusted in size until a peak of the transducer 2 coincides, at the desired frequency, with a peak of the transducer 5.

In this way two masters for producing electrodes in the patterns shown as 2 and 5 in FIG. 1 can be used in the manufacture of surface acoustic wave devices having a whole range of different frequency responses.

11 Claims, 5 Drawing Figures

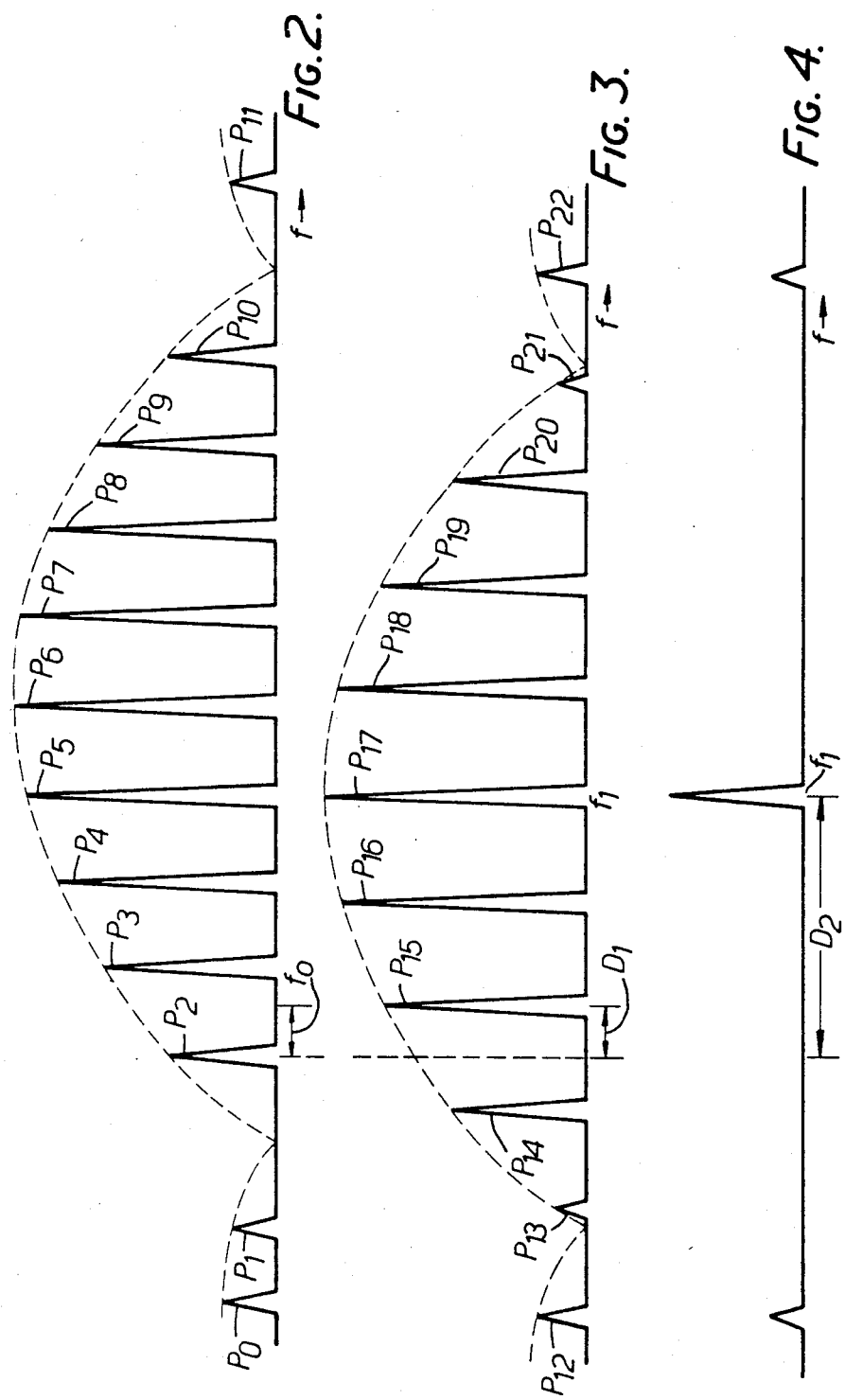

SURFACE ACOUSTIC WAVE DEVICES HAVING FREQUENCY RESPONSE THAT CAN BE ADJUSTED

BACKGROUND OF THE INVENTION

This invention relates to a surface acoustic wave device for transmitting surface acoustic waves along a surface between a first transducer and a second transducer. In such devices the transducers are normally formed by a series of interdigitated electrodes which are produced by a photolithographic process using a master exposure mask. The exposure mask needs to be made by sophisticated pattern generating equipment since the widths of the interdigitated electrodes are commonly in the range of 2 $\mu$m to 0.5 $\mu$m. The cost of making such masks is very high.

In order to make different surface acoustic wave devices which operate at respective different frequencies it has in the past been necessary to use different masks. Accordingly, when a need has arisen for a surface acoustic wave device operating at a particular frequency it has hitherto been necessary to include the cost of manufacturing an appropriate mask in the cost of the product. This invention arose with the aforementioned problem in mind.

The invention provides a surface acoustic wave device comprising: means for transmitting surface acoustic waves along a surface between a first transducer whose efficiency has a plurality of peaks at a first set of different frequency values and a second transducer whose efficiency has a plurality of peaks at a second set of different frequency values; means influencing the velocity of the waves in at least a region of the first transducer so as to displace the first set of frequency values relative to the second set thereby making one of the frequency values of the first set substantially coincide with one of the frequency values of the second set so that the device has a good frequency response at that frequency value, and other frequency values of the first set not coincide with frequency values of the second set so that the device does not have a good frequency response at the other values.

The velocity can be controlled in one or more of a number of different ways to be described later.

Each transducer is preferably formed by a plurality of groups of interdigitated electrodes, the groups being separated by a distance greater than the distance between electrodes of a given group. This type of electrode structure is able to provide the plurality of peak frequency values required. The surface acoustic wave velocity can be adjusted only to a limited extent, normally less than 3% and, accordingly, each transducer is preferably constructed so that any one of said frequency values differs from an adjacent frequency value by not more than 4 and preferably not more than 3% thereof.

In a preferred form of the invention, each pair of adjacent frequency values of the first set are separated by the same first frequency spacing and each pair of adjacent frequency values of the second set are separated by the same second frequency spacing which is different from the first frequency spacing. If the difference in frequency spacing is sufficiently small, then an appropriate velocity adjustment in the region of one of the transducers will cause the frequency values of the appropriate set to "slide" in relation to those of the other set in a manner similar to that of a vernier until coincidence of a particular frequency value of one set occurs with a frequency value of the other set.

The adjustment of velocity in a region of the first or second transducer will result in a finished product which may have different surface acoustic wave properties in the regions of the different transducers. The means for influencing the velocity may include a metal layer between electrodes of a transducer, the area or thickness or other dimension of this metal layer influencing the velocity. If the appropriate transducer contains a number of groups of interdigitated electrodes, this metal layer is preferably between the groups. Another possibility for influencing the velocity is to apply a layer of insulating material over one or both transducers. Another preferred possibility is to alter or control the thickness of the electrodes of the transducers.

While it would be possible to manufacture transducers which, in the first place, had characteristics giving the required velocity, it is more convenient to carry out a step of velocity adjustment. This can be done, in the case of the aforementioned metal layer or electrodes, by gradually eroding the metal layer while observing the frequency characteristics of the device. In the case of the use of a layer of insulating material then this can be gradually applied or removed, again while observing frequency characteristics.

BRIEF DESCRIPTION OF THE DRAWINGS

FIG. 2 shows schematically the relationship between frequency and efficiency of the transducer shown at the left hand side of FIG. 1;

FIG. 3 shows schematically the relationship between frequency and efficiency of the transducer shown at the right hand side of FIG. 1;

FIG. 4 shows schematically the relationship between frequency and efficiency of the whole delay line of FIG. 1.

DETAILED DESCRIPTION

Figure 1:
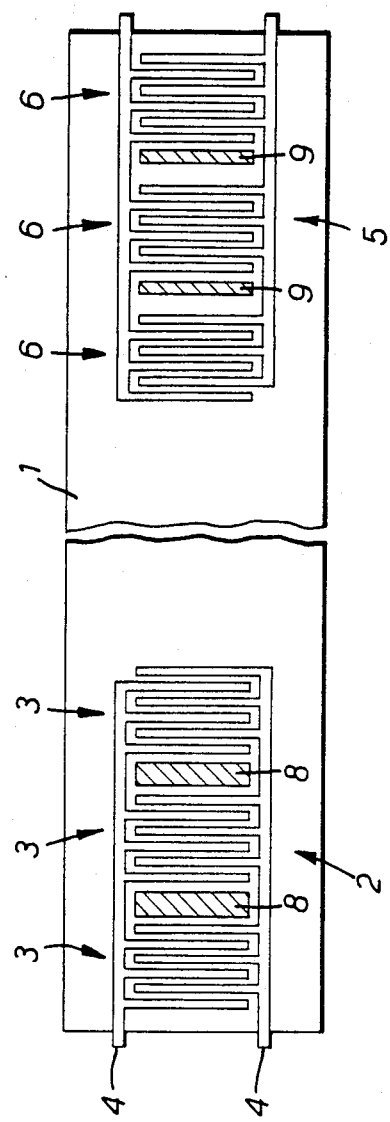
FIG. 1 is a plan view of a surface acoustic wave delay line constructed in accordance with the invention.

FIG. 1 shows a substrate 1 of piezoelectric material on which is deposited a transducer 2 comprising a number of groups 3 of electrodes formed by a metal layer. The electrodes are connected via terminals 4 to a source of electric signals and the signals are converted by the transducer 2 to surface acoustic waves which are propagated towards a second transducer 5. The particular arrangement of electrodes shown in FIG. 1 causes the transducer 2 to have peak efficiencies at a number of regularly spaced frequencies as shown by the peaks $P_{00}$ to $P_{11}$ indicated on FIG. 2.

The transducer 5 receives the surface acoustic waves launched by the transducer 2 and consists of groups 6 of electrodes similar to the groups 3 of transducer 2. The spacing between electrodes of transducer 5 is however different from the spacing between electrodes of transducer 2 and this results in a frequency response, shown in FIG. 3, which is similar to that of FIG. 2 except that the spacing between peaks $P_{12}$ to $P_{22}$ is different.

The peaks of FIG. 1 and/or FIG. 2 can be displaced to the left or to the right by changing the velocity of surface acoustic waves in the region of the appropriate transducer. This velocity is controlled by metal layers 8 on transducer 2 and metal layers 9 on transducer 3 which influence the velocity of surface acoustic waves along the surface beneath. It will be noted from FIG. 1 that the metal layers 9 are noticeably smaller than the metal layers 8, these having been eroded away (by ion milling, chemical etching, etc.) in order to achieve the desired frequency coincidence between peaks of $P_5$ and $P_{17}$ thereby providing a transducer with a good frequency response at frequency $f_1$. This is shown on FIG. 4 which illustrates the overall frequency response of the transducer which is a product of the efficiencies of the individual transducers 2 and 5.

Figure 5:
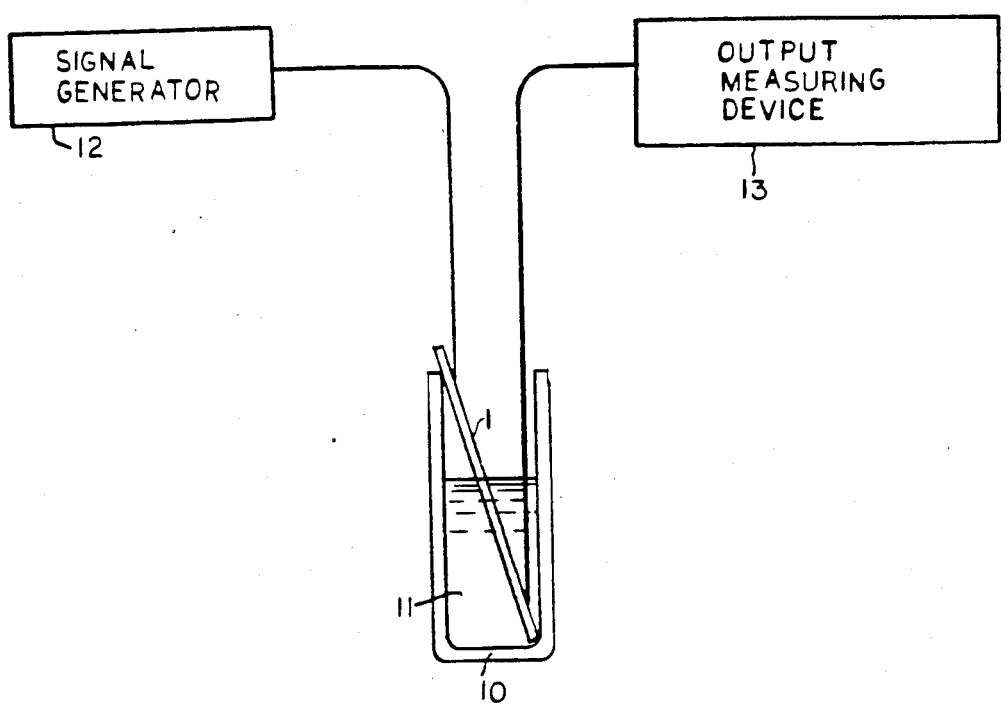
FIG. 5 is a schematic view illustrating adjustment of the acoustic surface wave device by erosion.

FIG. 5 illustrates an adjustment procedure schematically. In FIG. 5, substrate 1 is deposited in a container 10 of etchant 11. A signal generator 12 is connected to one transducer and the other transducer is connected to an output measuring device 13 so that the frequency characteristics of the device can be observed as the erosion progresses.

It will be appreciated from FIGS. 2 and 3 that a small displacement to the left or right of the peaks $P_1$ to $P_{11}$ and/or $P_{12}$ to $P_{22}$ will produce a much greater displacement in the frequency peak of FIG. 4. Thus, a small frequency displacement $D_1$ of the peaks shown in FIG. 3 will produce a much larger displacement $D_2$ of the frequency value at which the whole device operates. Hitherto such a large frequency displacement $D_2$ could only have been achieved satisfactorily by manufacturing a fresh master pattern.

I claim:

1. A surface acoustic wave device comprising:
   a first transducer having means for providing a plurality of efficiency peaks at a first set of different frequency values;
   a second transducer having means for providing a plurality of efficiency peaks at a second set of different frequency values;
   means for transmitting surface acoustic waves along a surface between said first and second transducers;
   means for influencing the velocity of the waves in at least a region of the first transducer so as to displace the first set of frequency values relative to the second set, said means for influencing the velocity including means for making one of the frequency values of the first set substantially coincide with one of the frequency values of the second set so that the device has a good frequency response at that frequency value, and other frequency values of the first set do not coincide with frequency values of the second set so that the device does not have a good frequency response at said other values.

2. A surface acoustic wave device according to claim 1 wherein each transducer is formed by a plurality of groups of interdigitated electrodes, said groups being separated by distance greater than the distance between electrodes for a given group.

3. A surface acoustic wave device according to claim 1 wherein any one of said frequency values differs from an adjacent frequency value by not more than 4% thereof.

4. A surface acoustic wave device according to claim 1 wherein each pair of adjacent frequency values of said first set are separated by the same first frequency spacing and each pair of adjacent frequency values of said second set are separated by the same second frequency spacing which is different from the first frequency spacing.

5. A surface acoustic wave device according to claim 1, further comprising means for influencing the velocity of the waves in at least a region of the second transducer.

6. A surface acoustic wave device according to claim 1 wherein said means for influencing the velocity includes a metal layer between electrodes of one of said transducers.

7. A surface acoustic wave device according to claim 6 wherein said metal layer is between groups of interdigitated electrodes.

8. A surface acoustic wave device according to claim 1 wherein said means for influencing velocity includes a layer of insulating material deposited over one or both transducers.

9. A method of making a surface acoustic wave device having means for transmitting surface acoustic waves along a surface between a first transducer having means for providing a plurality of efficiency peaks at a first set of different frequency values and a second transducer having means for providing a plurality of efficiency peaks at a second set of different frequency values, the method comprising: adjusting the properties of at least a region of the first transducer so as to influence the velocity of the waves in that region and to displace the first set of frequency values relative to the second set in the manner of a vernier; and determining when one of the frequency values of the first set is substantially co-incident with one of the frequency values of the second set, so that the device has a good frequency response at a predetermined frequency, before discontinuing the adjusting step.

10. A method according to claim 9 of making different surface acoustic wave devices having respective different frequency responses, further comprising the steps of producing the first transducers by reproducing, on the same scale, a pattern defined by a first common master and producing the second transducers by reproducing on the same scale a pattern defined by a second common master.

11. A method according to claim 9 of making different surface acoustic wave devices having respective different frequency responses, further comprising the steps of producing the first transducers by reproducing, on the same scale, a pattern defined by a common master and producing the second transducers by reproducing on the same scale a pattern defined by said common master.

* * * * *